(12) United States Patent
Lindsey, Jr.

(10) Patent No.: US 8,690,214 B2
(45) Date of Patent: Apr. 8, 2014

(54) PICK AND PLACE HANDLER WITH A FLOATING LOCK DEVICE

(75) Inventor: Alton R. Lindsey, Jr., El Cajon, CA (US)

(73) Assignee: Delta Design, Inc., Poway, CA (US)

( * ) Notice: Subject to any disclaimer, the term of this patent is extended or adjusted under 35 U.S.C. 154(b) by 0 days.

(21) Appl. No.: 13/591,762

(22) Filed: Aug. 22, 2012

(65) Prior Publication Data

US 2012/0313389 A1    Dec. 13, 2012

Related U.S. Application Data

(63) Continuation of application No. 12/318,596, filed on Dec. 31, 2008, now Pat. No. 8,272,673.

(51) Int. Cl.
*B25J 15/06* (2006.01)

(52) U.S. Cl.
USPC .......................................... 294/183; 294/185

(58) Field of Classification Search
USPC ......... 294/64.1, 183, 185; 901/40, 45; 29/743
See application file for complete search history.

(56) References Cited

U.S. PATENT DOCUMENTS

| | | | | |
|---|---|---|---|---|
| 4,078,671 | A | * | 3/1978 | Lundstrom ................... 414/627 |
| 4,202,107 | A | | 5/1980 | Watson |
| 5,193,776 | A | | 3/1993 | Nagai et al. |
| 5,549,340 | A | | 8/1996 | Nagai et al. |
| 6,240,628 | B1 | * | 6/2001 | Yoshida et al. ................. 29/740 |
| 6,318,777 | B1 | * | 11/2001 | Tanaka et al. ................. 294/185 |
| 6,457,759 | B1 | * | 10/2002 | Unokuchi ..................... 294/186 |
| 6,931,718 | B2 | * | 8/2005 | Isogai et al. .................... 29/743 |
| 7,100,955 | B2 | * | 9/2006 | Nakamura ....................... 294/65 |
| 7,543,868 | B1 | * | 6/2009 | Mongan ........................ 294/186 |
| 2002/0032960 | A1 | | 3/2002 | Lee |
| 2002/0083584 | A1 | | 7/2002 | Isogai et al. |
| 2003/0201652 | A1 | * | 10/2003 | Hoyt ............................ 294/64.1 |
| 2004/0074085 | A1 | | 4/2004 | Gieskes et al. |

* cited by examiner

*Primary Examiner* — Saul Rodriguez
*Assistant Examiner* — Gabriela Puig
(74) *Attorney, Agent, or Firm* — Foley & Lardner LLP (57) ABSTRACT

A semiconductor handler subassembly is provided. The semiconductor handler subassembly includes an adjustment apparatus with a floating lock that is configured to adjust and lock in place to a desired position, and a tip attached to the floating lock and configured to engage a part.

3 Claims, 8 Drawing Sheets

PICK AND PLACE HANDLER WITH A FLOATING LOCK DEVICE

CROSS-REFERENCE TO RELATED APPLICATION

This application is a continuation of U.S. patent application Ser. No. 12/318,596, filed on Dec. 31, 2008. The contents of this application is incorporated by reference in their entirety.

FIELD OF THE INVENTION

The present invention relates generally to semiconductor handlers. Specifically, the present invention is directed towards an adjustment apparatus that reduces the tolerance requirements of components of a semiconductor handler.

BACKGROUND

The following description of the background of the invention is provided simply as an aid in understanding the invention and is not admitted to describe or constitute prior art to the invention.

Many semiconductor handlers require high levels of precision in their adjustment and construction. As a result, the components that comprise these semiconductor handlers generally must be machined and constructed within low tolerance ranges. Construction of components within lower tolerance ranges requires expensive high precision machining. Additionally, as components are connected together, the deviation from the desired dimensions of each component may add together to create a semiconductor handler which in total deviates substantially from the intended design.

Accordingly, there is a need for an adjustment apparatus that provides adjustability to reduce the need for lower tolerance components in the construction of semiconductor handlers.

SUMMARY

According to one embodiment, a semiconductor handler subassembly is provided. The semiconductor handler subassembly includes an adjustment apparatus with a floating lock configured to adjust and lock in place to a desired position, and a tip attached to the floating lock and configured to engage a part.

According to another embodiment, a method of adjusting a semiconductor handler subassembly is provided. The method includes the steps of adjusting a floating lock to a desired position, and locking the floating lock in place.

It is to be understood that both the foregoing general description and the following detailed description are exemplary and explanatory only, and are not restrictive of the invention as claimed. These and other features, aspects and advantages of the present invention will become apparent from the following description, appended claims, and the accompanying exemplary embodiments shown in the drawings, which are briefly described below.

DETAILED DESCRIPTION

Embodiments of the present invention will be described below with reference to the accompanying drawings. It should be understood that the following description is intended to describe exemplary embodiments of the invention, and not to limit the invention.

Figure 6:
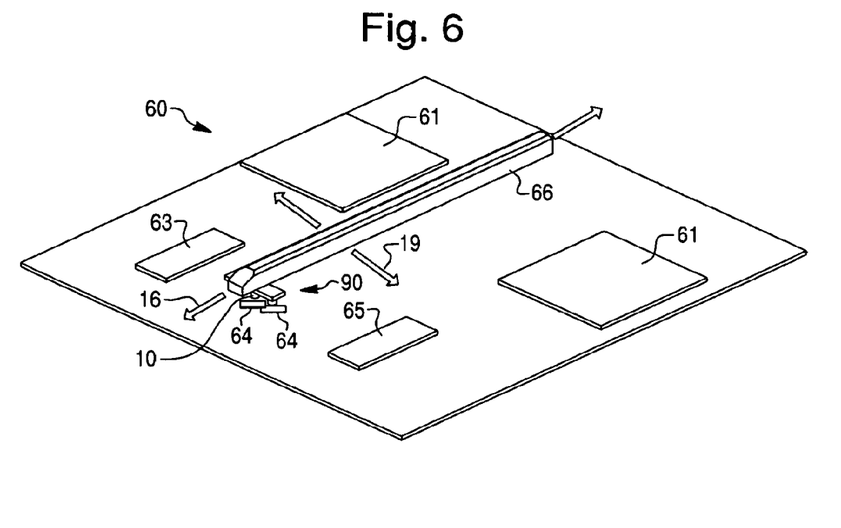
FIG. 6 is a side view of a semiconductor handler including a plurality of adjustment apparatuses, according to one embodiment.

FIG. 6 is a side view of a semiconductor handler 60 including a plurality of adjustment apparatuses 10, according to one embodiment. The semiconductor handler 60 includes a sub-assembly 90. Attached to the sub-assembly 90 is a plurality of adjustment apparatuses 10. The sub-assembly 90 is attached to a pickup head (not shown) that is disposed within the y-arm assembly 66. The sub-assembly 90 runs along the y-arm assembly 66 along planar axis 16. The y-arm assembly 66 moves along planar axis 19. The semiconductor handler 60 also includes a plurality of working areas 61. Each of the adjustment apparatuses 10 includes a tip (not shown) that is configured to engage a part 64. The tips (not shown) can engage a part 64 in a number of different ways. In some embodiments, the tip (not shown) can engage a part 64 through operation of a vacuum channel (24 of FIG. 2) connected to the tip (not shown), through which a vacuum is created to pick up and place the parts 64. In some embodiments incorporating a vacuum channel (24 of FIG. 2) an adjustment apparatus 10 includes an o-ring (15 of FIG. 1) to create a seal to prevent leakage of a vacuum present in the vacuum channel (24 of FIG. 2). In other embodiments, the tip (not shown) is configured to engage a part 64 in another fashion.

In the illustrated semiconductor handler 60, each of the adjustment apparatuses 10 have picked up a part 64 by their respective tips (not shown) from the input bin 63. Each of the parts 64 are transported by the pickup head (not shown) moving along planar axis 16 within the y-arm assembly 66 to a one of the plurality of working areas 61. The parts 64 are then placed onto a one of the plurality of working areas 61. Tests are performed on each of the parts 64. Once the tests are complete, the sub-assembly 90 attached to the pickup head (not shown) moves into place along planar axes 16 and 19 and the adjustment apparatuses 10 pick up each of the parts 64. The parts 64 are then transported to the output bin 65. The adjustability of the adjustment apparatuses 10 allow the components of the pickup head (not shown) and the y-arm assembly 66 to be machined and constructed to nearly any level of precision. For example, the components may be constructed to a lower level of precision because the adjustment apparatuses 10 can cancel or dial out any lack of precision through adjustment. Accordingly, the y-arm assembly 66 and the pickup head (not shown) can be constructed at a lower cost because the components may be constructed to a lower level of precision.

Figure 7:
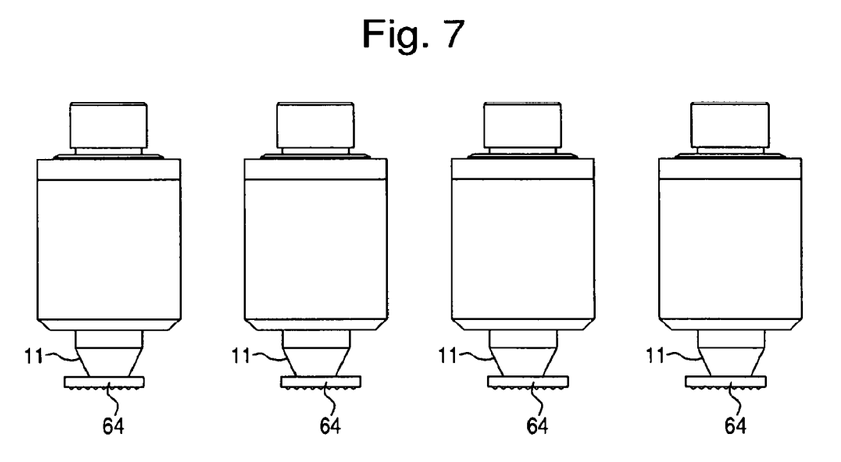
FIG. 7 is a side view illustrating misalignment of parts relative to tips of a semiconductor handler, according to one embodiment.

FIG. 7 is a side view illustrating misalignment of parts 64 relative to tips 11 of a semiconductor handler, according to one embodiment. The misalignment between the tips 11 and the parts 64 may occur in those semiconductor handlers that do not incorporate an embodiment of an adjustment apparatus 10 of the present disclosure. The likelihood of misalignment increases as the part 64 size decreases. When testing parts 64 of very small sizes, the tips 11 are correspondingly very small, and the distance between each of the tips 11 and the tolerance of adjustment for the tips 11 is very small. Embodiments of the adjustment apparatus 10 as described in the present disclosure avoid these misalignment problems by allowing the tips 11 to easily adjust relative to one another and relative to the semiconductor handler itself.

Figure 8:
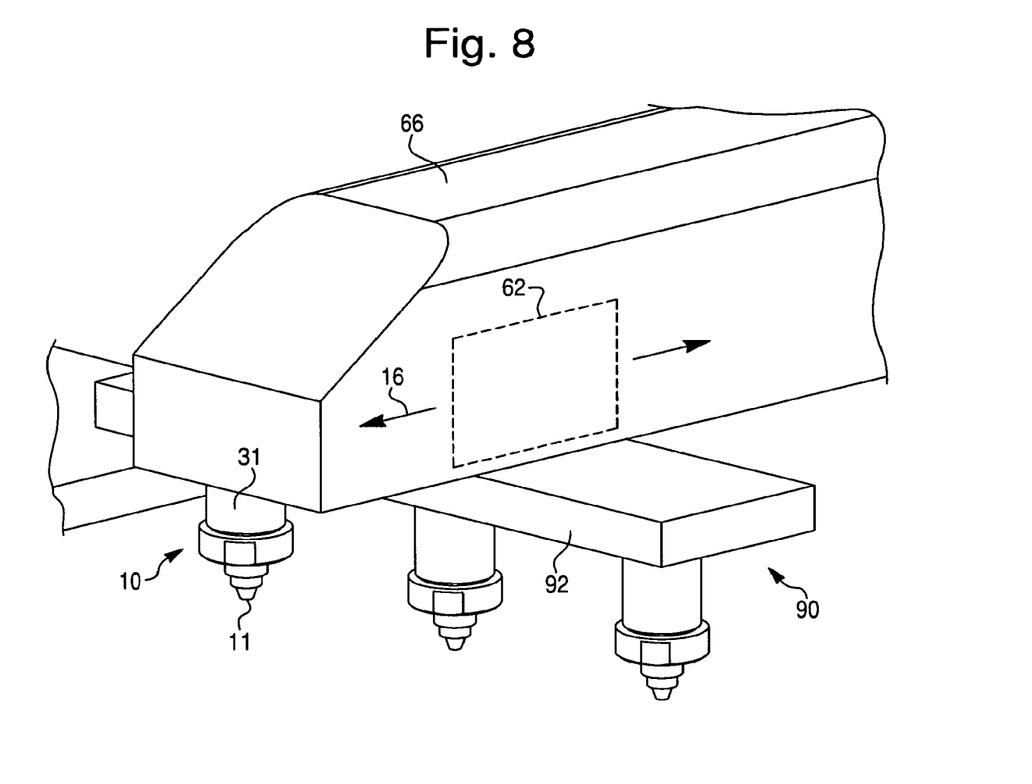
FIG. 8 is a side view of a semiconductor handler including a plurality of adjustment apparatuses attached to a sub-assembly, according to one embodiment.

FIG. 8 is a side view of a semiconductor handler including a plurality of adjustment apparatuses 10 attached to a sub-assembly 90, according to one embodiment. The sub-assembly 90 includes a head 92 and a plurality of tip receivers 31. Attached to each tip receiver 31 is an adjustment apparatus 10. The adjustment apparatus 10 includes a tip 11. The sub-assembly 90 is attached to a pickup head 62 that is disposed within the y-arm assembly 66. The pickup head 62 and attached sub-assembly 90 run along the y-arm assembly 66 along planar axis 16.

In some applications, the adjustment apparatus 10 may be employed in a semiconductor handler subassembly. By way of example, the upper attachment 14 may be connected to a component of a handler subassembly. Further, the handler subassembly may be designed to adhere to precise design guidelines. A tip 11 is attached to the floating lock 13. The tip 11 is used to pick up and place components, such as semiconductor devices. In some embodiments, the tip 11 picks up and places components using vacuum. The tip's 11 alignment relative to other components of the handler subassembly depends on the adjustment of the floating lock 13 and the level of precision of the construction of the other components of the handler subassembly. However, the floating lock 13 through its adjustability is capable of cancelling out the lack of precision of the other components of the semiconductor subassembly. For example, if the component to which the upper attachment 14 is connected is 40 thousands of an inch beyond the dimensions of the design of the handler subassembly, the floating lock 13 can be adjusted to compensate for those 40 thousands of an inch, thereby bringing the tip 11 into correct alignment relative to the other components of the handler subassembly.

Figure 9:
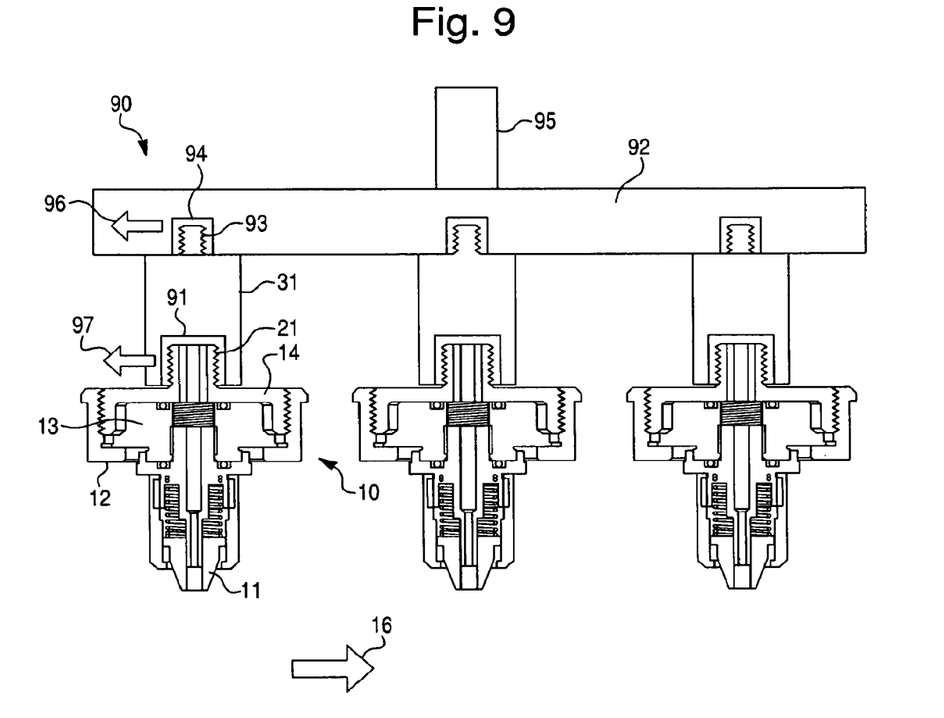
FIG. 9 is a side view of the embodiment shown in FIG. 1 in a semiconductor handler subassembly.

Taking for example the handler subassembly 90 shown in FIG. 9. FIG. 9 is a side view of the embodiment shown in FIG. 1 in a semiconductor handler subassembly 90. In the illustrated application, each of the floating locks 13 of each of the adjustment apparatuses 10 loosely fit between an upper attachment 14 and a collar 12, which allows the floating lock 13 to adjust and lock in place to a desired position when the collar 12 and the upper attachment 14 are sufficiently tightly engaged. Each of the tips 11 are attached to the floating locks 13. The upper attachments 14 are each connected to a tip receiver 31 through a threaded upper attachment portion 21. The threaded upper attachment portion 21 inserts and engages a threaded female portion 91 of the tip receiver 31. Each of these tip receivers 31 are connected to the head 92 through a threaded tip receiver portion 93. The threaded tip receiver portion 93 inserts and engages a threaded female portion 94 of the head 92. The head 92 is attached to the arm 95.

The design of the semiconductor handler subassembly 90 may include precise dimensions for each of the arm 95, head 92, tip receivers 31, upper attachments 14, and collars 12. Mechanical systems designed with precise dimensions generally require expensive component construction and machining to adhere to design limitations. If the semiconductor handler subassembly 90 did not include the adjustment apparatuses 10 as shown, any deviation from the design dimensions of any of the components (collars 12, upper attachments 14, tip receivers 31, head 92, and arm 95) of the semiconductor handler subassembly 90 may compound with one another which could result in a semiconductor handler subassembly 90 that significantly deviates from the design specification. For example, the threaded female portion of left-most tip receiver 91 may be machined such that the female portion 91 is 40 thousands off-center in the dimension represented by the arrow 97. Similarly, the left threaded portion of the head 94 may be machined such that it is 80 thousands off-center in the direction represented by the arrow 96 (the dimension being the same dimension in which the threaded female portion of left-most tip receiver 91 is off-center).

Without any adjustment, the left-most tip 11 would potentially be 120 thousands of an inch off of the design specification, as the two machining errors for the threaded female portion of left-most tip receiver 91 and the left threaded portion of the head 94 are in the same dimension. However, the lack of precise machining for each of these components may be remedied by adjusting the left-most floating lock 13 in the opposite direction of the machining errors of the threaded female portion of left-most tip receiver 91 and the left threaded portion of the head 94, thereby more precisely lining up the attached left-most tip 11 to the design specification of the semiconductor handler subassembly 90. The adjustment of the floating lock 13 is continuous along planar direction 16 and the planar axis directed away from the figure (not shown) (these axes are orthogonal to one another), and the adjustability feature can be used to cancel or reduce any planar error. Further, the adjustment apparatuses 10 may easily be adjusted relative to one another.

Figure 1:
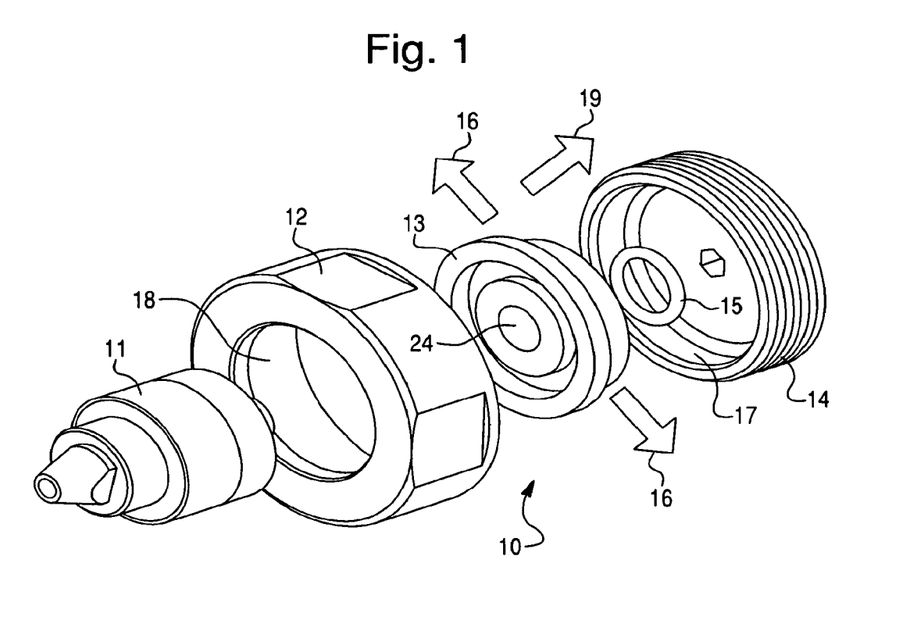
FIG. 1 is an exploded view of an adjustment apparatus, according to one embodiment.

FIG. 1 is an exploded view of an adjustment apparatus 10, according to one embodiment. The adjustment apparatus 10 includes a floating lock 13, a collar 12, and an upper attachment 14. The floating lock 13 is configured to loosely fit between the collar 12 and the upper attachment 14. The collar 12 engages the upper attachment 14. As the collar 12 engages the upper attachment 14, a cavity is created by the inner part of the collar 18 and the inner part of the upper attachment 14. The floating lock 13 fits within the cavity and is capable of adjusting in planar directions 16 and 19 (these axes are orthogonal to one another) within the cavity when the upper attachment 14 and the collar 12 are not sufficiently tightly engaged.

As the collar 12 and the upper attachment 14 become more engaged, the cavity created by the inner part of the collar 18 and the inner part of the upper attachment 17 becomes smaller to the point where the bottom surface of the floating lock 13 engages the collar 12 and the top surface of the floating lock 13 engages the upper attachment. When the collar 12 and the upper attachment 14 are sufficiently tightly engaged, the floating lock 13 is locked in place. The floating lock 13 is locked in place between the upper attachment 14 and the collar 12 by the mechanical pressure each exerts on the floating lock 13. The mechanical pressure created by sufficient engagement between the collar 12 and the upper attachment 14 only allows floating lock 13 to move along planar axes 16 and 19 against significant friction, thereby locking the floating lock 13 in place in the desired position. In some embodiments, the adjustment apparatus 10 also includes an o-ring 15 to prevent leakage of a vacuum present in a vacuum channel 24 (24 in FIG. 2).

The components of the adjustment apparatus 10 may be comprised of a variety of different materials. In some embodiments, the floating lock 13 is comprised of steel. The steel may be high carbon or low carbon steel. The steel may also be stainless. In some embodiments, the floating lock 13 is comprised of aluminum. In alternative embodiments, the floating lock 13 is comprised of brass derivative metals such as bronze and copper. In other embodiments, a floating lock 13 may be comprised of other materials, or a combination of materials.

In some embodiments, the collar 12 is comprised of steel. The steel may be high carbon or low carbon steel. The steel may also be stainless. In some embodiments, the collar 12 is comprised of aluminum. In alternative embodiments, the collar 12 is comprised of brass derivative metals such as bronze and copper. In other embodiments, a collar 12 may be comprised of other materials, or a combination of materials.

In some embodiments, the upper attachment 14 is comprised of steel. The steel may be high carbon or low carbon steel. The steel may also be stainless. In some embodiments, the upper attachment 14 is comprised of aluminum. In alternative embodiments, the upper attachment 14 is comprised of brass derivative metals such as bronze and copper. In other embodiments, an upper attachment 14 may be comprised of other materials, or a combination of materials.

In some embodiments, the tip 11 is comprised of steel. The steel may be high carbon or low carbon steel. The steel may also be stainless. In some embodiments, the tip 11 is comprised of aluminum. In alternative embodiments, the tip 11 is comprised of brass derivative metals such as bronze and copper. In other embodiments, a tip 11 may be comprised of other materials, or a combination of materials.

The o-ring 15 may also be comprised of different types of material. In some embodiments, the o-ring 15 is comprised of rubber. The rubber may be natural or artificial. The o-ring may also be comprised of polyurethane. In alternative embodiments, the o-ring is comprised of plastic. In some embodiments, the o-ring is comprised of metal. The metal may be steel, aluminum, or a brass derivative. In some embodiments, the o-ring is coated in plastic, rubber, or polyurethane. In other embodiments, an o-ring may be comprised of other materials, or a combination of materials. Similarly any fasteners or the lower attachment (51 of FIG. 5) may be comprised of a variety of materials.

Figure 2:
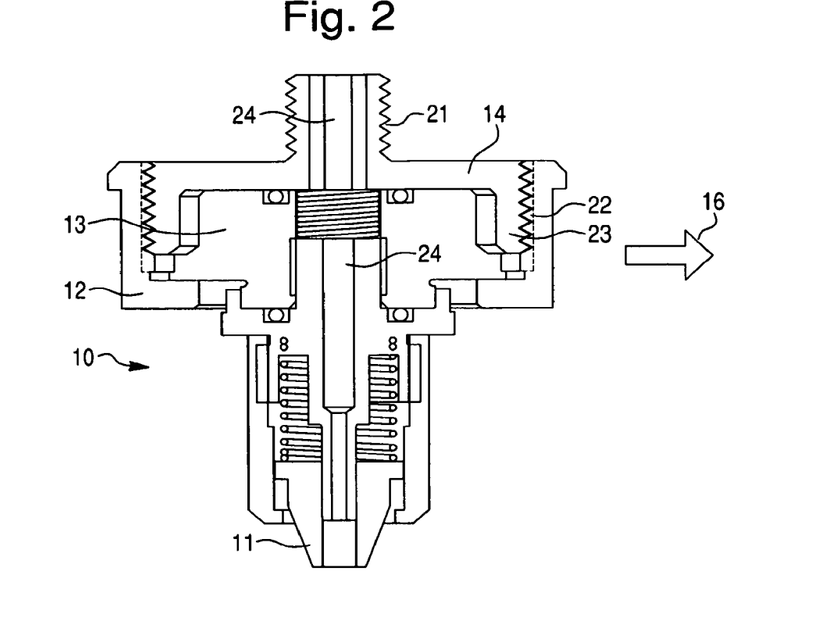
FIG. 2 is a sectional view of the embodiment shown in FIG. 1.

FIG. 2 is a sectional view of the embodiment shown in FIG. 1. The adjustment apparatus 10 includes a floating lock 13, a collar 12, and an upper attachment 14. The floating lock 13 fits loosely between an upper attachment 14 and a collar 12. The collar 12 engages the upper attachment 14. The floating lock's 13 position is adjustable along planar axis 16 and the planar axis directed away from the figure (not shown) (these axes are orthogonal to one another), between the collar 12 and the upper attachment 14 when the upper attachment 14 and the collar 12 are not sufficiently tightly engaged. When the collar 12 and the upper attachment 14 are sufficiently tightly engaged, the floating lock 13 is locked in place. The floating lock 13 is locked in place between the upper attachment 14 and the collar 12 by the mechanical pressure each exerts on the floating lock 13. The mechanical pressure created by sufficient engagement between the collar 12 and the upper attachment 14 only allows floating lock 13 to move along planar axes 16 and the planar axis directed away from the figure (not shown) against significant friction, thereby locking the floating lock 13 in place in the desired position. The engagement between the upper attachment 14 and the collar 12 is accomplished by the threads of the upper attachment 23 and the threads of the collar 22. In other embodiments the engagement between the collar 12 and the upper attachment 14 is accomplished by machining the collar 12 and the upper attachment 14 to be beveled with respect to one another. In still other embodiments, the engagement between the collar 12 and the upper attachment 14 may be accomplished by securing the collar 12 and the upper attachment 14 together through a fastener. In other embodiments, other manners of engagement between the collar 12 and the upper attachment 14 may be provided.

A tip 11 is attached to the floating lock 13 and moves along with the floating lock 13. Some embodiments include a vacuum channel 24 that is connected to the tip 11 through which a vacuum is created. The upper attachment 14 further includes a threaded portion 21 which allows the upper attachment 14 to be threaded into a receiving portion of another mechanical component. In some embodiments, the upper attachment 14 is attached to the other mechanical component by securing the upper attachment 14 to the other mechanical component by a fastener. In still other embodiments, the upper attachment 14 is attached to the other mechanical component by machining the upper attachment 14 and the other mechanical component to be beveled with respect to one another. In other embodiments, other manners of attachment between the upper attachment 14 and the other mechanical component may be provided.

Figure 3:
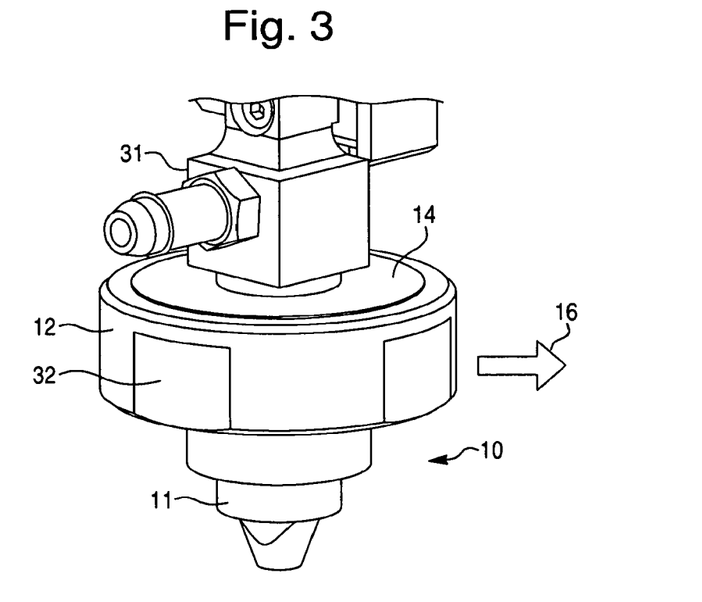
FIG. 3 is a side perspective view of the embodiment shown in FIG. 1.

FIG. 3 is a side perspective view of the embodiment shown in FIG. 1. This side view illustrates an upper attachment 14, a collar 12, and a tip 11 which is attached to a floating lock (not shown). The upper attachment 14 is attached to a tip receiver 31. The tip 11 may be adjusted relative to the tip receiver 31 by adjusting the floating lock (not shown) along planar axis 16 and the planar axis directed away from the figure (not shown) (these axes are orthogonal to one another) and locking it in place by engaging the collar 12 and the upper attachment 14. As shown, in some embodiments the collar 12 includes a plurality of flat edges 32. The plurality of flat edges 32 may be used in combination with a tool to engage the collar 12 and the upper attachment 14. In other embodiments, the collar 12 does not include a plurality of flat edges, and another appropriate tool such as an adjustable wrench may be used to engage the collar 12 and the upper attachment 14.

Figure 4:
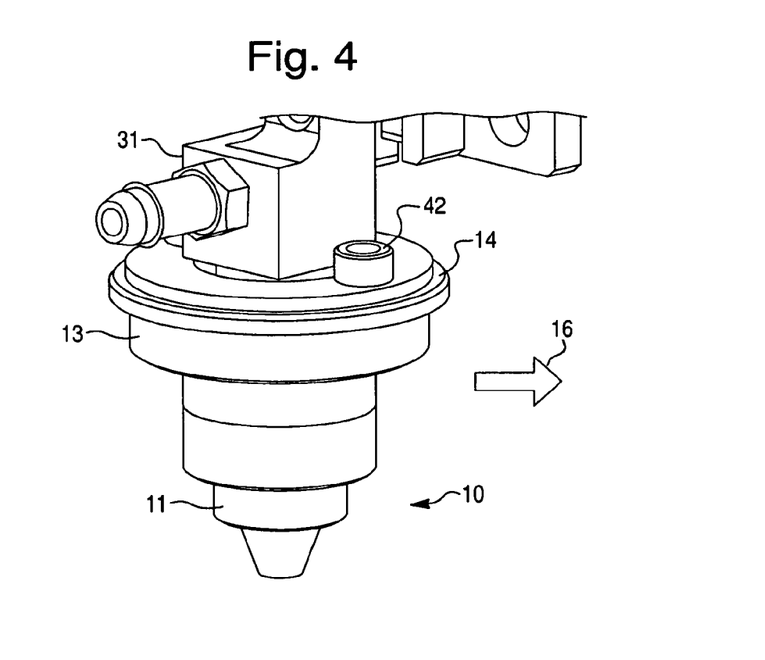
FIG. 4 is a side perspective view of an adjustment apparatus attached to a tip receiver, according to one embodiment.

FIG. 4 is a side perspective view of an adjustment apparatus 10 attached to a tip receiver 31, according to one embodiment. This side view illustrates an upper attachment 14 attached to a tip receiver 31, and a tip 11 attached to a floating lock 13. The fastener 42 inserts through an opening in the upper attachment 14 larger than the diameter of the fastener 42. The fastener 42 is configured to engage floating lock 13 and mechanically pull the floating lock 13 together with the upper attachment 14. When the fastener 42 is not sufficiently engaged with the floating lock 13, the fastener's 42 shank may loosely adjust within the opening of the upper attachment 14 that is larger in diameter than the fastener 42. Accordingly, when not sufficiently engaged, the floating lock 13/fastener 42 assembly may adjust relative to the upper attachment 14 and the tip receiver 31 along planar axis 16 and the planar axis directed away from the figure (not shown) (these axes are orthogonal to one another). In this way, the tip 11 may be adjusted relative to the upper attachment 14 and the tip receiver 31.

Once the fastener 42 is sufficiently tightly engaged with the floating lock 13, the floating lock 13 is locked into the desired position and tip 11 is placed into a desired position relative to the upper attachment 14 and the tip receiver 31. When the fastener 42 is sufficiently engaged the floating lock 13 and the upper attachment 14 are mechanically held together by the fastener 42. The mechanical pressure created by the sufficient engagement only allows the floating lock 13 to move along planar axis 16 and the planar axis directed away from the figure (not shown) against significant friction, thereby locking the floating lock 13 in place in the desired position.

In some embodiments, the fastener 42 may be a threaded fastener and the floating lock 13 is threaded to engage the fastener 42. In yet other embodiments, the fastener 42 may expand once inserted into the floating lock 13 to engage the floating lock 13. In other embodiments, the fastener 42 may engage the floating lock 13 in another manner. Some embodiments related to FIG. 4 include an additional fastener.

Figure 5:
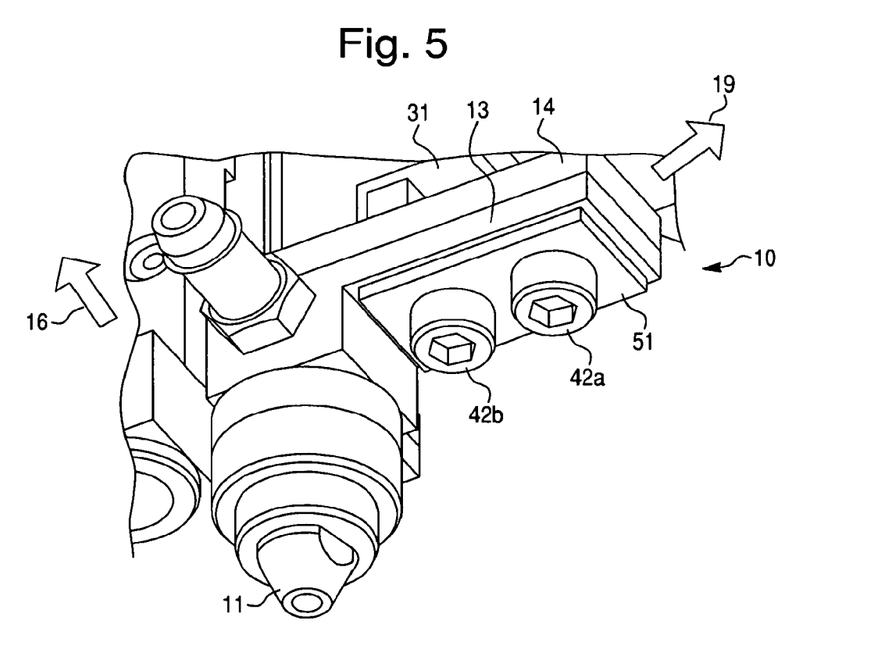
FIG. 5 is a perspective view of an adjustment apparatus attached to a tip receiver, according to one embodiment.

FIG. 5 is a perspective view of an adjustment apparatus 10 attached to a tip receiver 31, according to one embodiment. The perspective view illustrates an upper attachment 14 attached to a tip receiver 31, and a tip 11 attached to a floating lock 13. The floating lock 13 is positioned between the upper attachment 14 and the lower attachment 51. The floating lock 13 has two openings that are larger in diameter than the two fasteners 42a and 42b. The fasteners 42a and 42b can be inserted through openings in the lower attachment 51 and are configured to engage the upper attachment 14 to mechanically pull together the upper attachment 14, the floating lock 13, and the lower attachment 51. Some embodiments do not include a lower attachment 51, and the fasteners are inserted directly through the floating lock 13. When the fasteners 42a and 42b are not sufficiently engaged with the upper attachment 14, each of the fasteners' 42a and 42b shanks may loosely adjust within the openings of the floating lock 13. Accordingly, when not sufficiently engaged, the floating lock 13 may adjust relative to the upper attachment 14 and the tip receiver 31 along planar axes 16 and 19 (these axes are orthogonal to one another). Once the fasteners 42a and 42b are sufficiently tightly engaged with the upper attachment 14, the floating lock 13 is locked into the desired position and the tip 11 is placed into a desired position relative to the upper attachment 14 and the tip receiver 31. In those embodiments with a lower attachment 51, when the fasteners 42a and 42b are sufficiently engaged the floating lock 13, lower attachment 51, and the upper attachment 14 are mechanically held together by fasteners 42a and 42b. In those embodiments without a lower attachment 51, when the fasteners 42a and 42b are sufficiently tightly engaged the floating lock 13 and the upper attachment 14 are mechanically held together by fasteners 42a and 42b.

The mechanical pressure created by the sufficient engagement only allows the floating lock 13 to move along planar axes 16 and 19 against significant friction, thereby locking the floating lock 13 in place in the desired position. In some embodiments, the fasteners 42a and 42b may be a threaded fastener and the upper attachment 14 is threaded to engage the fasteners 42a and 42b. In yet other embodiments, the fasteners 42a and 42b may expand once inserted into the upper attachment 14 to engage the floating lock 13. In other embodiments, the fasteners 42a and 42b may engage the upper attachment 14 in another manner.

In another embodiment related to FIG. 5, a floating lock 13 is positioned between the upper attachment 14 and the lower attachment 51. The floating lock 13 has two openings that are larger in diameter than the two fasteners 42a and 42b. The fasteners 42a and 42b can be inserted through the upper attachment 14 and are configured to engage the lower attachment 51 to mechanically pull together the upper attachment 14, the floating lock 13, and the lower attachment 51. When the fasteners 42a and 42b are not sufficiently engaged with the lower attachment 51, each of the fasteners' 42a and 42b shanks may loosely adjust within the openings of the floating lock 13. Accordingly, when not sufficiently engaged, the floating lock 13 may adjust relative to the upper attachment 14 and the tip receiver 31 along planar axes 16 and 19 (these axes are orthogonal to one another). Once the fasteners 42a and 42b are sufficiently tightly engaged with the upper attachment 14, the floating lock 13 is locked into the desired position and the tip 11 is placed into a desired position relative to the upper attachment 14 and the tip receiver 31. When the fasteners 42a and 42b are sufficiently tightly engaged the floating lock 13, lower attachment 51, and the upper attachment 14 are mechanically held together by fasteners 42a and 42b.

The mechanical pressure created by the sufficient engagement only allows the floating lock 13 to move along planar axes 16 and 19 against significant friction, thereby locking the floating lock 13 in place in the desired position. In other words, in the related embodiment, the fasteners 42a and 42b are configured to engage the lower attachment 51 and not the upper attachment 14. In some embodiments, the fasteners 42a and 42b may be a threaded fastener and the lower attachment 51 is threaded to engage the fasteners 42a and 42b. In yet other embodiments, the fasteners 42a and 42b may expand once inserted into the lower attachment 51 to engage the floating lock 13. In other embodiments, the fasteners 42a and 42b may engage the lower attachment 51 in another manner.

In yet another related embodiment to FIG. 5, two fasteners 42a and 42b may be provided. In such an embodiment, one of the fasteners inserts through the upper attachment 14 and engages the lower attachment 51. The other fastener inserts through the lower attachment 51 and engages the upper attachment 14.

Figure 10:
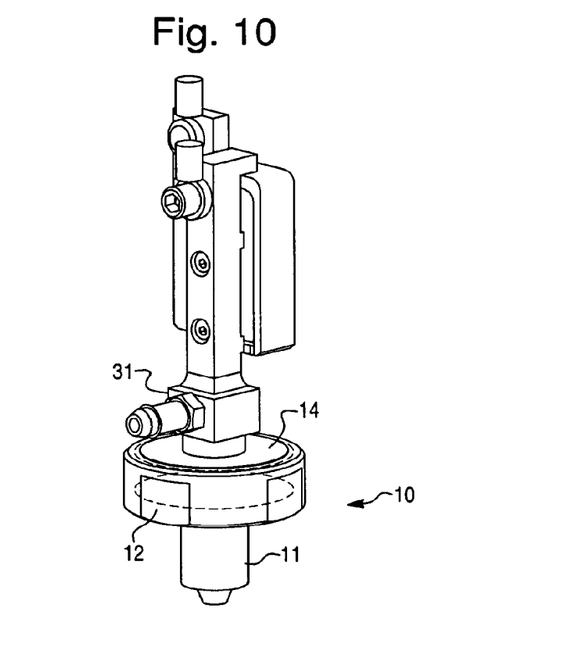
FIG. 10 is a side view of the embodiment shown in FIG. 1 attached to a semiconductor handler tip receiver, according to one embodiment.

FIG. 10 is a side view of the embodiment shown in FIG. 1 attached to a semiconductor handler tip receiver 31, according to one embodiment. The semiconductor handler tip receiver 31 is attached to the adjustment apparatus 10 by attachment to the upper attachment 14. The tip 11 may be adjusted relative to the tip receiver 31 by adjusting the floating lock (not shown) and locking it in place by engaging the collar 12 and the upper attachment 14.

Figure 11:
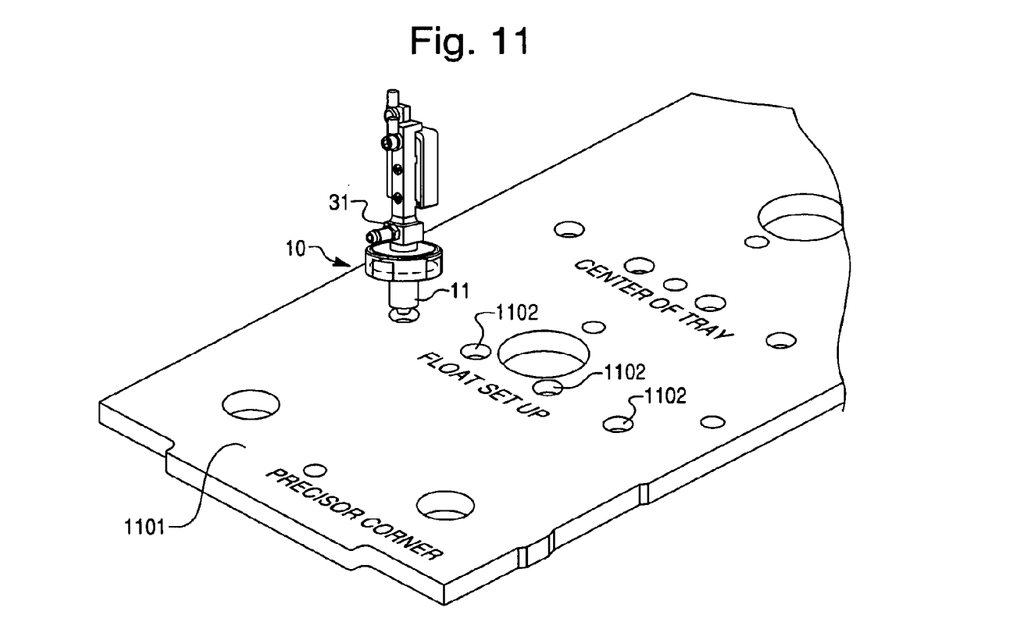
FIG. 11 is a top-down view of the FIG. 1 embodiment of an adjustment apparatus attached to a semiconductor handler tip receiver, and an adjustment plate, according to one embodiment.

FIG. 11 is a top-down view of the FIG. 1 embodiment of an adjustment apparatus 10 attached to a semiconductor handler tip receiver 31, and an adjustment plate 1101, according to one embodiment. The adjustment plate 1101 is configured with a plurality of openings 1102 that are substantially the same size as the tip 11 attached to the adjustment apparatus 10 assembly. In operation, the adjustment apparatus 10 may be adjusted by placing the tip 11 attached to the adjustment apparatus 10 into one of the plurality of openings of the adjustment plate 1102 as well as placing another stationary component attached to the semiconductor handler (not shown) into one of the other of plurality of openings of the adjustment plate 1102. In this way, the adjustment apparatus 10 may be adjusted relative to the semiconductor handler itself, as well as the stationary component.

In some embodiments, multiple adjustment apparatuses are attached to a semiconductor handler subassembly. Accordingly, these adjustment apparatuses may be similarly adjusted relative to each other, a stationary component, and the semiconductor handler. By way of example, each of the adjustment apparatuses 10 in FIG. 9 may be adjusted relative to one another, as well as each tip receiver 31, the head 92, and the arm 95.

Figure 12:
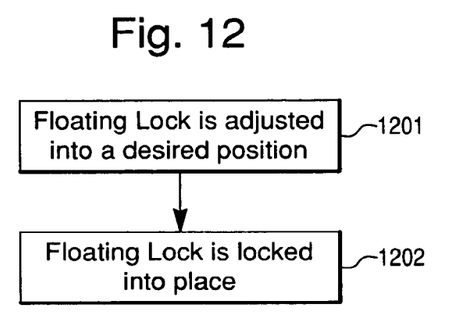
FIG. 12 is a flowchart describing adjustment of a semiconductor handler subassembly, according to one embodiment.
Figure 13:
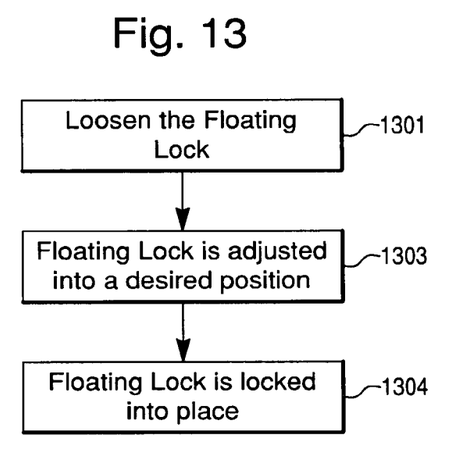
FIG. 13 is a flowchart describing adjustment of a semiconductor handler subassembly, according to one embodiment.

FIGS. 12 and 13 are flowcharts describing adjustment of a semiconductor handler subassembly according to one embodiment. In FIG. 12, in step 1201 a floating lock 13 is adjusted into a desired position. In step 1202 following 1201, the floating lock 13 is locked into place. FIG. 13 is a flowchart describing adjustment of another embodiment of a semiconductor handler subassembly. In step 1301 a floating lock 13 is first loosened. In step 1302 following step 1301, the floating lock 13 is adjusted into a desired position. In step 1303 following step 1302, the floating lock 13 is locked into place.

The present adjustment apparatus 10 provides controlled adjustability relative to an object to which it is attached. The adjustment apparatus 10 is employed in a semiconductor handler subassembly. The adjustment apparatus 10 allows the other components of the semiconductor handler subassembly to be constructed to lower levels of precision, because the adjustment apparatus 10 can cancel or dial out any lack of precision. The adjustment apparatus 10 allows a semiconductor handler subassembly to be constructed at lower cost because the need for high precision machining and construction of components is reduced. Additionally, the adjustment apparatus 10 provides precise alignment of components relative to one another.

The foregoing description of embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principals of the invention and its practical application to enable one skilled in the art to utilize the invention in various embodiments and with various modifications as are suited to the particular use contemplated.

What is claimed is:

1. A method of adjusting a semiconductor handler subassembly of a pickup head of a semiconductor handler, wherein the semiconductor handler subassembly includes an attachment, comprising the steps of:

adjusting a floating lock by movement along a plane parallel to the attachment into a desired position, wherein the floating lock is positioned adjacent to the attachment and a tip is attached to the floating lock and configured to engage a part, and wherein the attachment has an opening larger than a diameter of a fastener; and locking the floating lock in place by inserting the fastener through the opening of the attachment and engaging the fastener with the floating lock.

2. The method of claim 1, further comprising the step of:

loosening the floating lock before adjusting the floating lock into the desired position.

3. The method of claim 1, wherein the step of adjusting the floating lock further comprises inserting the tip attached to the floating lock into an adjustment plate.

* * * * *